United States Patent [19]

Lemelson

[11] Patent Number: 4,974,498

[45] Date of Patent: Dec. 4, 1990

[54] INTERNAL COMBUSTION ENGINES AND ENGINE COMPONENTS

[76] Inventor: Jerome Lemelson, Call Box 14-286, Incline Village, Nev. 89450

[21] Appl. No.: 488,248

[22] Filed: Mar. 5, 1990

Related U.S. Application Data

[63] Continuation-in-part of Ser. No. 32,352, Mar. 31, 1987.

[51] Int. Cl.⁵ .................................................. F02F 3/00
[52] U.S. Cl. ................................... 92/223; 123/193 P
[58] Field of Search ........................... 92/222, 223, 224; 123/193 P; 427/213

[56] References Cited

U.S. PATENT DOCUMENTS

| | | | |
|---|---|---|---|
| 1,975,818 | 8/1932 | Work | 92/223 |
| 3,459,167 | 8/1969 | Briggs et al. | 92/223 |
| 3,552,370 | 1/1971 | Briggs | 92/223 |
| 3,911,891 | 10/1975 | Dowell | 92/224 |
| 4,334,507 | 6/1982 | Kohnert et al. | 92/224 |
| 4,798,770 | 1/1989 | Dunomoto et al. | 92/224 |
| 4,859,493 | 8/1989 | Lemelson | 427/213 |
| 4,863,807 | 9/1989 | Krasicky | 92/224 |

Primary Examiner—Andrew M. Dolinar
Assistant Examiner—M. Macy

[57] ABSTRACT

Improvements in internal combustion engines and/or components thereof resulting from applying thin coatings or films of synthetic diamond or diamond-like material thereto and, in certain instances, overcoating such synthetic diamond material with a thin layer of chromium for providing certain protective effects. In one form, the entire piston of an internal combustion engine is coated with a thin layer of synthetic diamond material protecting same against heat and chemical corrosion effects during the operation of the engine. In another form, piston rings or ring components are coated with such synthetic diamond material in thicknesses varying from 0.00001" to 0.001" or more. Retaining cavities formed in the head of the piston which retain the piston rings may also be similarly coated. The piston pin and/or its retaining rings may also contain such synthetic diamond material coating as may the top and side walls of the piston. An overcoating of a hard film of chromium may be applied to one or more of the engine components against the synthetic diamond material to protect same against particle erosion and abrasion. Other engine components so protected may include the engine crank shaft or those portions thereof subjected to wear when the surfaces of the bearings of the piston rods engage same and the bearings in which the crank shaft rotates.

19 Claims, 1 Drawing Sheet

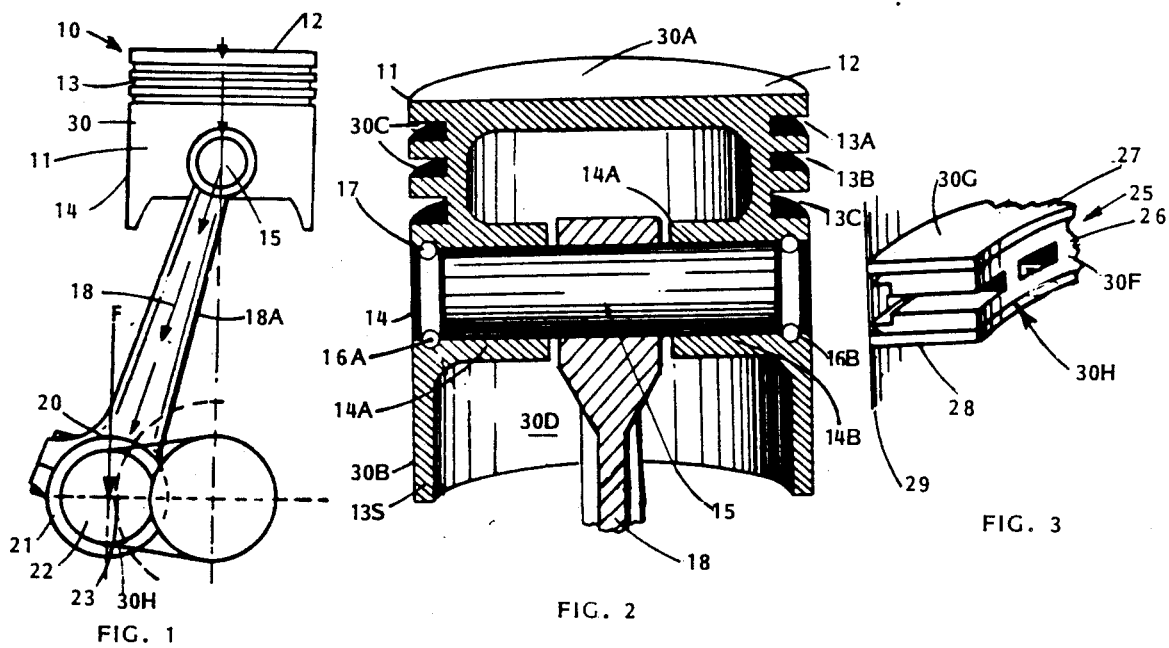
FIG. 1
FIG. 2
FIG. 3
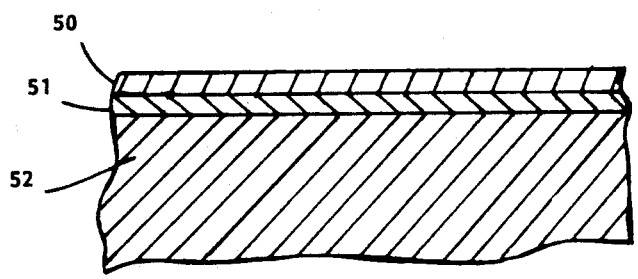
FIG. 4

INTERNAL COMBUSTION ENGINES AND ENGINE COMPONENTS

RELATED APPLICATIONS

This is a continuation-in-part of application Ser. No. 032,352 filed Mar. 31, 1987.

SUMMARY OF THE INVENTION

This invention relates to improvements in structures in components of internal combustion engines such as the pistons, piston rings, piston rods, bearings and crank shafts of the engine wherein the entire surfaces or select surface portions thereof subjected to wear and heat corrosion as well as deformation, are coated with thin films of synthetic diamond material deposited in situ thereon from carbon atoms removed from carbon atom containing gas or other fluid disposed adjacent the component as the result of beaming microwave energy therethrough.

Accordingly it is a primary object of this invention to provide new and improved structures in internal combustion engine components which will resist heat corrosion and erosive effects during use.

Another object is to provide improved structures in components for internal combustion engines which will resist surface erosion and failure due to surface cracks.

Another object is to provide improvements in the structures of components for internal combustion engines having increased resistance to failure due to impact loads during fuel ignition.

Another object is to provide new and improved bearings for use in internal combustion engines, such as crankshaft bearings, bearing sleeves and the like which contain composite surface coatings of synthetic diamond and protective overcoatings of chromium offering greater resistance to frictional wear and crack failure.

Still another primary object of this invention is to provide a new and improved structure in a piston assembly for an internal combustion engine.

Another object is to provide an improved piston for an internal combustion engine having at least its top wall portion coated with a synthetic diamond material operable to resist erosion and corrosion during the operation of the internal combustion engine containing such piston.

Another object is to provide a piston for an internal combustion engine having one or more circular channels or cavities in its side wall for receiving and retaining one or more piston rings therein, wherein the walls of such cavities are coated with a hard synthetic diamond material.

Another object is to provide a piston ring or ring assembly for an internal combustion engine which has one or more surfaces thereof subject to wear and erosion coated with a hard synthetic diamond material.

Another object is to provide an improved component of a piston assembly for an internal combustion engine coated with a hard synthetic diamond material which is overcoated with a dry lubricating layer, such as a thin layer of chromium.

Another object is to provide an improved piston for an internal combusion engine, the entire surface of which is coated with hard synthetic diamond to protect same against corrosion, erosion and wear.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

In the drawings:

FIG. 1 is a side view of a piston assembly for an internal combustion engine showing a piston, connecting pin, connecting rod and part of a crankshaft to which the connecting rod is pivotally connected.

FIG. 2 is a side cross-sectional view of an internal combustion engine piston and part of a connecting rod connected to the piston by a cylindrical connecting pin.

FIG. 3 is an isometric view of a portions of the cylinder wall and a portion of a piston ring assembly wiping the cylinder wall.

FIG. 4 is a side cross-sectional view of a portion of the surface stratum of the piston or connecting rod of FIGS. 1 and 2 or part of the assembly of FIG. 3.

In FIGS. 1 and 2 is shown details of part of an internal combustion engine piston assembly 10 including a piston 11 having a piston pin 15 extending between opposite portions of the cylindrical side wall 13 of the piston and pivotally supporting a connecting rod 18 connecting the piston assembly with a crankshaft 23 which is rotated by longitudinal movement of the piston in a cylinder bore per se or in cooperation with one or more additional similarly constructed pistons. The piston pin 15 is slidably supported within bosses 14A and 14B extending inwardly from the piston side wall, by snap rings 16A and 16B which frictionally secure to recesses in respective of the cylindrical walls of the piston bosses.

The piston 11 is formed with three circumscribing circular cavities 13A, 13B and 13C in which piston ring assemblies 25 of the type shown in FIG. 3 are retained for sealing the piston and cylinder wall against pressure loss during engine operation. The end of piston rod 18 contains an assembly 20 including a bearing 21 securing same to a select portion 22 of the engine crankshaft 23.

In FIG. 3, each piston ring assembly 25 comprises a center scraper ring 26 and top and bottom steel rails or rings 27 and 28 assembled therewith.

To provide improved resistance to wear, heat corrosion, pitting and crack failure during use, the entire outer surface portions of piston 11, piston pin 15 and the connecting rod 18, a scraper ring 26, steel rails or rings 27 and 28 or one or more select portions of each of such components, are coated with a hard synthetic diamond material formed in situ therein such as by means disclosed in my U.S. Pat. No. 4,859,493, such coatings being applied in thicknesses varying from about 10 millionths of an inch to a thousandth of an inch or more. In one embodiment, the outer surface of the top wall 12 of piston 11 is subject to substantial heat and chemical corrosion as well as the effects of shock waves during the operation of the internal combustion engine and contains a coating 30A of synthetic diamond material covering same to a depth of between 0.0001" to 0.001" or more, while the outer cylindrical surface 13S of the side wall 13 and the wall or walls of the cavities 13A to 13C, may similarly be coated to the same depth or less with synthetic diamond material as may be the inserts 22 or bearings which rotationally support the piston rod on the crank shaft 23. Similarly, collars or inserts surrounding those portions of the crank shaft 23 may also be totally or partly coated with such synthetic diamond material to resist wear and corrosion and the effects of shock waves and impacts during use.

The scraper 26 and/or steel rails 27, 28, forming the piston ring assembly, may also be coated with synthetic diamond material or such material may be limited to the surfaces thereof which engage the inside surface of the cylinder wall during movement of the piston back and forth within the cylinder. If such cylinder wall is defined by a cylindrically shaped sleeve inserted in a metal casting, it too may be coated with a synthetic diamond material to resist wear due to sliding friction and heat corrosion.

All of the coatings of synthetic diamond material described herein may be overcoated with a hard wear resistant protective lubricating material 31, such as chromium, chromium alloy or other similar material deposited in situ against the outer surfaces of the diamond coating material to protect same against chemical attack, scouring and the like.

While notation 30A refers to that portion of the synthetic diamond material deposited on and coating the top surface of the piston 11, other portions 30B, 30C, and 30C of such diamond material are shown applied respectively to the outer cylindrical surface of the side wall 13S of the piston, the inside surfaces of the circumscribing channels 13A, 13B and 13C of the piston in which the piston ring assemblies are retained and the inside surfaces of the piston including the inside surfaces of the piston pin bosses 14A and 14B to strengthen and protect the surfaces thereof from heat corrosion and the expansion or extension of surface defects and cracks therein which may eventually cause failure of the piston.

For certain engine applications, it may merely be necessary to coat the outer or top surface of the end wall 12 with synthetic diamond material formed from carbon atoms which are stripped from molecules of a hydrocarbon gas, such as methane or other suitable hydrocarbon or carbon atom containing material, by the application of suitable radiation, such as microwave radiation passed through such gas in a coating chamber containing the piston or exposing a select portion or portions thereof to the gas. Other applications may require coating those portions of the piston exposed to combustion, such as the end wall 12 and a portion of the side wall adjacent thereto including one or more of the piston ring containing channels, with such synthetic diamond material, with or without all such surface portions being plated or vapor deposited with chromium or the like for lubrication and surface protection. Similarly, the entire or a select portion of the inside surface of the combustion chamber or engine cylinder or cylinder liner 29 are coated with synthetic diamond and chromium or the like to protect same against frictional wear, chemical and heat corrosion and the extension of growth of surface cracks due to variable loading and impact forces during engine operation. Such coating 30D on the inside surface of the piston may be applied simultaneously as the outer surfaces of the piston are similarly coated or in a separate operation. The piston ring 26 is shown containing a similar coating or plurality of coatings as described above while the scraper or support rings 27 and 28 may contain or be left void of such coating materials.

While not subject to hot combustion gases, pistons and displacers of Stirling engines may be similarly protected from erosion and/or impact failure by similarly coating same as well as piston rings and ring assembly components thereof and the surfaces of the external burners and components for such engines which are subject to high temperature, burning fuel and impact loading.

If fuel injection is employed with such internal or external combustion engines, the injections nozzles and components subject to high temperatures of combustion and impact loading may also be similarly coated with thin layers of synthetic diamond material and, if necessary, protective overcoatings as described herein.

In FIG. 4 is shown structural details of the synthetic diamond coatings, the protective overcoatings and the substrates coated. The substrate, which may be any of the configurations hereinabove described, is denoted 52 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 50 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Depending on operating requirements, the protective coating materials described herein may be applied in accordance with the following teachings and limitations:

(a) The entire piston 11 including its external and internal surfaces may be coated with synthetic diamond per se or contain a composite multi-layer coating of synthetic diamond overcoated with chromium of other suitable protective or solid luricant as described.

(b) Just the upper surface of the piston subject to the direct heat and impact pressures of combustion may be so coated with synthetic diamond or such material overcoated as described.

(c) Upper piston surface 30A and a contiguous portion of the cylindrical side wall of the piston may be so coated and protected, which contiguous side wall portion may include one or more of the channels or circular cavities 13 which retain the piston rings assembled to the piston, a portion of the sidewall therebelow or the entire side wall to the exclusion of the interior surfaces of the piston.

(d) The coating(s) on the top surface 30A of the piston 11 may be formed in situ thereon as described to a thickness which is greater that such coating(s) on the side wall thereof.

(e) Such coatings may also extend into the cylindrical bore or passageway 14 of the bosses 14A and 14B to protect same from wear, corrosion and surface crack failure and may also be applied to the entire outer surfaces of the piston pin 15.

(f) The entire outer surface or select portions of the outer surface of the connecting rod 18 may be similarly coated with synthetic diamond with or without the described protective overcoating applied thereto.

(g) The bearings or bearing inserts at either or both ends of the connecting rod 18 as well as those machined portions of the crankshaft 23 which rotate in such inserts or bearings may also be similarly coated with synthetic diamond material with or without the described protective overcoating material to protect same against wear during operational rotation of the crankshaft.

(h) The cylinder wall 29 of FIG. 3 may be defined by a sleeve or liner of suitable material which is force fit into a bore in the engine casting. The inside surface of the cylindrical side wall of the liner may be coated as described with a thin layer of synthetic diamond which may be overcoated with chromium, chromium alloy or one or more of the described metals or alloys of chromium, vanadium, molybdenum, titanium, aluminum or tungsten in thickness sufficient to protect the undercoating of synthetic diamond from the erosive effects of the piston, piston ring(s) and particles in the combustion gases and lubricant used in operation of the engine.

(i) The combustion chamber may be defined in part by a cylinder head containing exhaust and inlet ports formed therein or secured thereto which may also be similarly coated with chromium or the like and/or synthetic diamond to protect same against failure or pitting due to heat and chemical corrosion, impact forces of combustion and expansion and contractions during heating and cooling prior to, during and after engine operation, in structures and by means described herein.

(j) Exhaust and inlet valve components such as valves and valve stems may also be similarly coated with chromium and/or synthetic diamond material as described to protect same against degradation and failure caused by heat and chemical corrosion as well as the forces of combustion and impact forces during their operation.

Certain modifications to the structures and methods for making same may be found in may parent application Ser. No. 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer surface or surfaces of the articles to the exclusion of another area or areas thereof for functional and/or economic purposes. Such an electron beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubricate and protect the surface of the synthetic diamond coating.

4. Coatings formed of a plurality of layers of synthetic diamond material formed as described between respective layers of the same or different metals, metal alloys and/or ceramic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof as set forth in such patent may also be mixed with such particulate material(s) to form articles of the type(s) described herein having superior substrate strength and corrosion resistance. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at temperature to burn away the resin leaving a porous substrate of desired shape. By placing such porous substrate in a chamber containing a mixture of hydrocarbon gas and hydrogen under pressure, molecules of the gas mixture will flow into the pores or intersticies of such substrate, particularly if the chamber and substrate therein are first subjected to suitable vacuum. Thereafter by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characterics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications.

What is claimed is:

1. A piston for an internal combustion engine formed with an upper surface against which hot gases of combustion react during the operation of said engine, said upper surface containing a thin coating of synthetic diamond material deposited in situ thereon and integrally bonded thereto.

2. A piston for an internal combustion engine in accordance with claim 1 having a cylindrical side wall portion, said coating of synthetic diamond material extending from the upper surface thereof to at least a portion of the side wall of said piston.

3. A piston in accordance with claim 2 formed of aluminum or aluminum alloy and having at least one circular cavity formed in its side wall, the walls of said cavity containing said synthetic diamond material coating same.

4. A piston in accordance with claim 3 including a piston ring retained within said circular cavity in the side wall of said piston, said piston ring being coated with synthetic diamond material formed in situ thereon.

5. A piston in accordance with claim 4 wherein the circular peripheral surface of said piston ring is coated with a solid luricating material protecting said diamond coating thereon, said solid lubricating material selected from the group of metals, alloys, nitrides, carbides and oxides of the metals chromium, vanadium, titanium and aluminum.

6. A piston in accordance with claim 1 said synthetic diamond material coating the upper surface of said piston having an overcoating deposited thereon selected from the group of metals and alloys of chromium, vanadium, titanium and tungsten.

7. A piston in accordance with claim 2 having a thin coating of chromium deposited against the outer surface of said synthetic diamond material, both said coatings being in the range of 0.00001 to 0.005" in thickness.

8. A piston ring for use in assembly with a piston adapted for longitudinal movement in a cylinder of an engine such as an internal combustion engine, compressor, fluid pump or the like comprising:
    (a) a flexible solid metal ring-like formation of substantially circular configuration and having a substantially cylindrical outer surface conformable to the cylindrical inside surface of an engine cylinder in which said piston is adapted for reciprocating travel,
    (b) a first coating of synthetic diamond material integrally bonded to said cylindrical outer surface of said flexible ring-like formation, and
    (c) a coating of solid lubricating material selected from the group of metals comprising chromium, vanadium, titanium and tungsten and alloys thereof integrally bonded to said synthetic diamond material.

9. A piston ring in accordance with claim 8 wherein said synthetic diamond coating and the material coated thereon completely cover the surface of said solid metal ring-like formation.

10. An internal combustion engine having at least one combustion chamber with a cylindrical side wall and a piston adapted for reciprocating travel in said chamber during the operation of said engine and subject to varying forces and high temperatures of combustion, said piston having an end wall and cylindrical side wall portions, a first layer of synthetic diamond material coating said end wall and at least a portion of said side wall of said piston adjacent said end wall of said piston, and a second layer of synthetic diamond material coating at least that portion of said cylindrical side wall of said combustion chamber which is subject to combustion gases during the operation of said internal combustion engine.

11. An internal combustion engine in accordance with claim 10, said piston having a channel formed in its side wall and a piston ring supported within said channel and slidably engaging said cylindrical side wall of said combustion chamber, said synthetic diamond material disposed within a coating the walls of said channel.

12. An internal combustion engine in accordance with claim 10 having a crankshaft and a connecting rod connecting said piston to said crankshaft, means for pivotally supporting one end of said connecting rod to said piston and a layer of synthetic diamond material coating a select portion of said latter means from wear and mechanical failure during the operation of said engine.

13. An internal combustion engine in accordance with claim 12 wherein said pivotal supporting means at one end of said connecting rod includes cylindrical bearing means having a coating of synthetic diamond material and an overcoating of chromium for protecting said bearing means from wear and failure during the operation of said engine.

14. An internal combustion engine in accordance with claim 12 including bearing means secured to one end of said connecting rod and a cylindrical portion of said crankshaft rotationally supported by said bearing means, at least one of said bearing means and crankshaft being coated with synthetic diamond sufficient in thickness to protect same from wear and impact failure during the operation of said engine.

15. An internal combustion engine in accordance with claim 14 having a layer of protective material selected from the group of metals and alloys containing chromium, vanadium, molybdenum, titanium, aluminum and tungsten overcoating said synthetic diamond material.

16. An internal combustion engine in accordance with claim 10 wherein said combustion chamber has an end wall portion and side wall portions which respectively do and do not become aligned with said piston during the operation of said engine and which are subject to the heat, force and corrosive effects of combustion during the operation of said engine, the entire surfaces of said end wall and side wall portions of said combustion chamber being coated with a layer of synthetic diamond material operable to protect same from degradation and failure due to heat, corrosion and pressures of combustion.

17. An internal combustion engine in accordance with claim 10 wherein said combustion chamber includes a cylinder head containing exhaust and inlet ports and valve means assembled therewith for admitting and exhausting operating fluids with respect to said chamber, there being coatings of said synthetic diamond material deposited on the surface of said exhaust port of said cylinder head.

18. An internal combustion engine in accordance with claim 17 having having exhaust and inlet valve components assembled with said cylinder head and extending through said exhaust and inlet ports, at least a select portion of said exhaust valve component being coated with a synthetic diamond material.

19. An internal combustion engine in accordance with claim 10 including a cylindrical insert assembled with and lining the side wall of said combustion chamber in which insert said piston travels, the inside surface of said insert being coated with said synthetic diamond material and a thin layer of chromium overcoating said synthetic diamond material coating the inside surface of said insert.

* * * * *